US00RE41691E

(19) United States
(12) Reissued Patent
Reed, Jr.

(10) Patent Number: US RE41,691 E
(45) Date of Reissued Patent: Sep. 14, 2010

(54) METHOD AND APPARATUS FOR PERFORMING JOINT TIMING RECOVERY OF MULTIPLE RECEIVED SIGNALS

(76) Inventor: Charles Reed, Jr., 1224 University Dr., Yardley, PA (US) 19067

(21) Appl. No.: 11/805,865

(22) Filed: May 23, 2007

Related U.S. Patent Documents

Reissue of:
(64) Patent No.: 6,947,498
Issued: Sep. 20, 2005
Appl. No.: 09/835,030
Filed: Apr. 13, 2001

(51) Int. Cl.
*H04L 27/14* (2006.01)

(52) U.S. Cl. ..... 375/326; 375/344; 375/376; 375/355; 455/439; 455/522; 327/150; 327/159; 714/700

(58) Field of Classification Search ..... 375/326, 375/344, 376, 355; 455/139, 522; 327/150, 327/159; 714/700; 370/507
See application file for complete search history.

(56) References Cited

U.S. PATENT DOCUMENTS 3,555,194 A * 1/1971 Goto ..... 370/507
5,321,850 A * 6/1994 Backstrom et al. ..... 455/139
6,169,907 B1 * 1/2001 Chang et al. ..... 455/522
6,307,413 B1 10/2001 Dalmia et al.
2002/0049936 A1 * 4/2002 Gutnik et al.
2002/0136342 A1 * 9/2002 Lee et al.
2003/0016087 A1 * 1/2003 Yamane et al.
2003/0085739 A1 * 5/2003 Totsuke

OTHER PUBLICATIONS

U.S. Appl. No. 60/221,709, filed on Jul 31, 2000.*
Gutnik et al., "Clock Distribution Circuits and Methods of Operating Same That Use Multiple Clock Circuits Connected By Phase Detector Circuits To Generate and Synchronize Local Clock Signals".
Lee et al., "Sample and Hold Type Fractional–N Frequency Synthesizer".
Yamane et al., "Phase–Locked Loop Circuit and Data Reproduction Apparatus".
Totsuke, "Method of and Apparatus for Detecting Difference Between Frequencies, And Phase Locked Loop Circuit".

* cited by examiner

*Primary Examiner*—Eva Y Puente
(74) *Attorney, Agent, or Firm*—McDonnell Boehnen Hulbert & Berghoff LLP

(57) ABSTRACT

Method and apparatus for performing joint timing recovery in a digital receiver using multiple input signals. The apparatus comprises a plurality of phase detectors, a summer, a level shifter, a loop filter and a numerically controlled oscillator NCO. The phase detectors produce a phase signal by comparing a timing signal produced by the NCO with the input signals. The phase signals are then summed and the level shifter adjusts the summed value to compensate for the number of signals used to form the sum, i.e., the summed value is adjusted to be within the input range of the NCO.

12 Claims, 2 Drawing Sheets

100

100

METHOD AND APPARATUS FOR PERFORMING JOINT TIMING RECOVERY OF MULTIPLE RECEIVED SIGNALS

Matter enclosed in heavy brackets [ ] appears in the original patent but forms no part of this reissue specification; matter printed in italics indicates the additions made by reissue.

*This application is a reissue application for U.S. Pat. No. 6,947,498 issued on Sep. 20, 2005.*

The invention relates to data synchronization techniques and, more particularly, the invention relates to a method and apparatus for performing joint timing recovery in a digital receiver using multiple received signals.

BACKGROUND OF THE DISCLOSURE

Data signals transmitted through a communication network are subject to various distortions caused by the transmission medium or channel. Distortions such as noise, channel fading and multipath may cause errors in decoding a received digital signal. For example, multipath may severely distort or fade a received signal. To mitigate multipath induced distortion, the receiver may utilize receiver diversity, i.e., use multiple antennas to receive multiple versions of a transmitted signal.

The receiver demodulates and decodes the multiple received signals and combines the signals into a suitable format for an appliance such as a television, computer, and the like. To accurately perform such demodulation and decoding, the receiver must provide proper timing recovery of the received signals. However, such timing recovery of multiple signals is difficult in the presence of multipath and channel fading.

Therefore, there is a need in the art to provide a method and apparatus for performing joint timing recovery in a digital receiver using multiple input signals.

SUMMARY OF THE INVENTION

The present invention provides a method and apparatus for performing joint timing recovery in a digital receiver using multiple input signals. The apparatus comprises a plurality of phase detectors, a summer, a level shifter, a loop filter and a numerically controlled oscillator NCO. Each of the phase detectors produces a phase signal by comparing a timing signal produced by the NCO with each of the input signals. The phase signals are then summed and the level shifter adjusts the summed value to compensate for the number of signals used to form the sum, i.e., the summed value is adjusted to be within the input range of the NCO.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
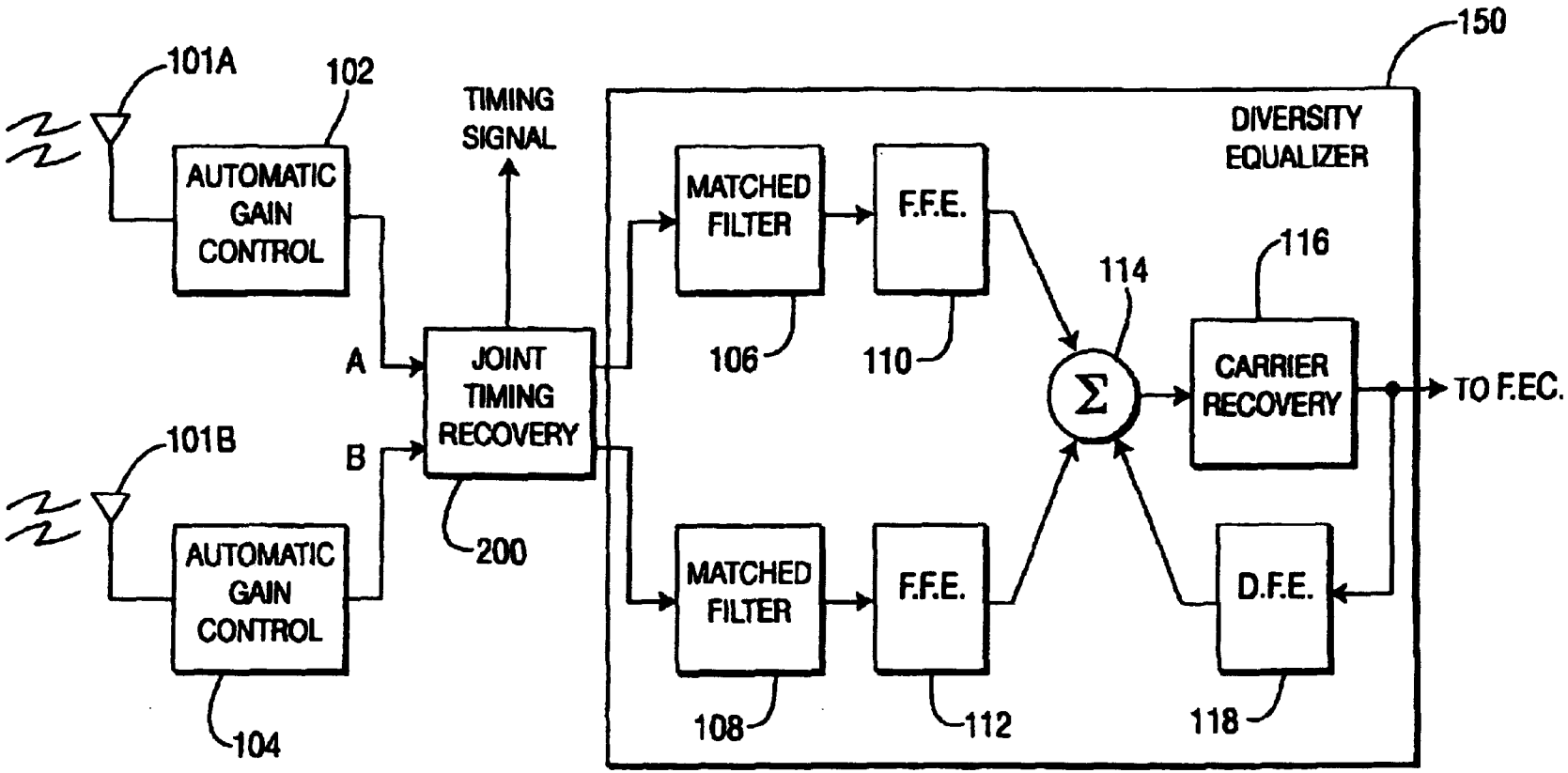
FIG. 1 depicts a block diagram of a front end of a receiver using the joint timing recovery circuit of FIG. 2.

FIG. 1 depicts a block diagram of a front end of a digital receiver 100 using a joint timing recovery circuit 200 of the present invention. In one embodiment, the digital receiver 100 is a QAM (Quadrature Amplitude Modulation) diversity receiver using multiple antennas 101 to receive a previously transmitted signal. Although the illustrative receiver 100 receives and processes two input signals, the receiver 100 may likewise receive and process any plurality of input signals.

Illustratively, the front end comprises automatic gain control (AGC) circuits 102 and 104, a joint timing recovery circuit 200, matched filters 106 and 108, feed forward equalizers (FFE) 110 and 112, a summer 114, a carrier recovery circuit 116 and a decision feedback equalizer (DFE) 118.

Inputs from the antennas 101A and 101B are stabilized at the respective AGC circuits 102 and 104. The output of the AGC circuits 102 and 104 are coupled to the joint timing recovery circuit 200 described with reference to FIG. 2. A common timing signal is derived in the circuit 200 and coupled to the matched filter 106 and 108. The matched filters 106 and 108, the FFEs 110 and 112, the summer 114, and the DFE 118 form a diversity equalizer 150. The matched filters 106 and 108 correlate the input signals in a conventional manner. The FFEs 110 and 112 equalize the matched filter outputs that are then coupled to the summer 114 with the output of the DFE 118. The summed output from the summer 114 is then used in the carrier recovery circuit 116. The carrier recovery circuit 116 recovers the carrier used to transmit the signal to the antennas 101A and 101B. The recovered carrier is then coupled to a forward error correction (FEC) module for further processing.

One embodiment of a diversity equalizer is disclosed in U.S. patent application Ser. No. 09/776,078, filed Feb. 2, 1001, which is herein incorporated by reference.

Figure 2:
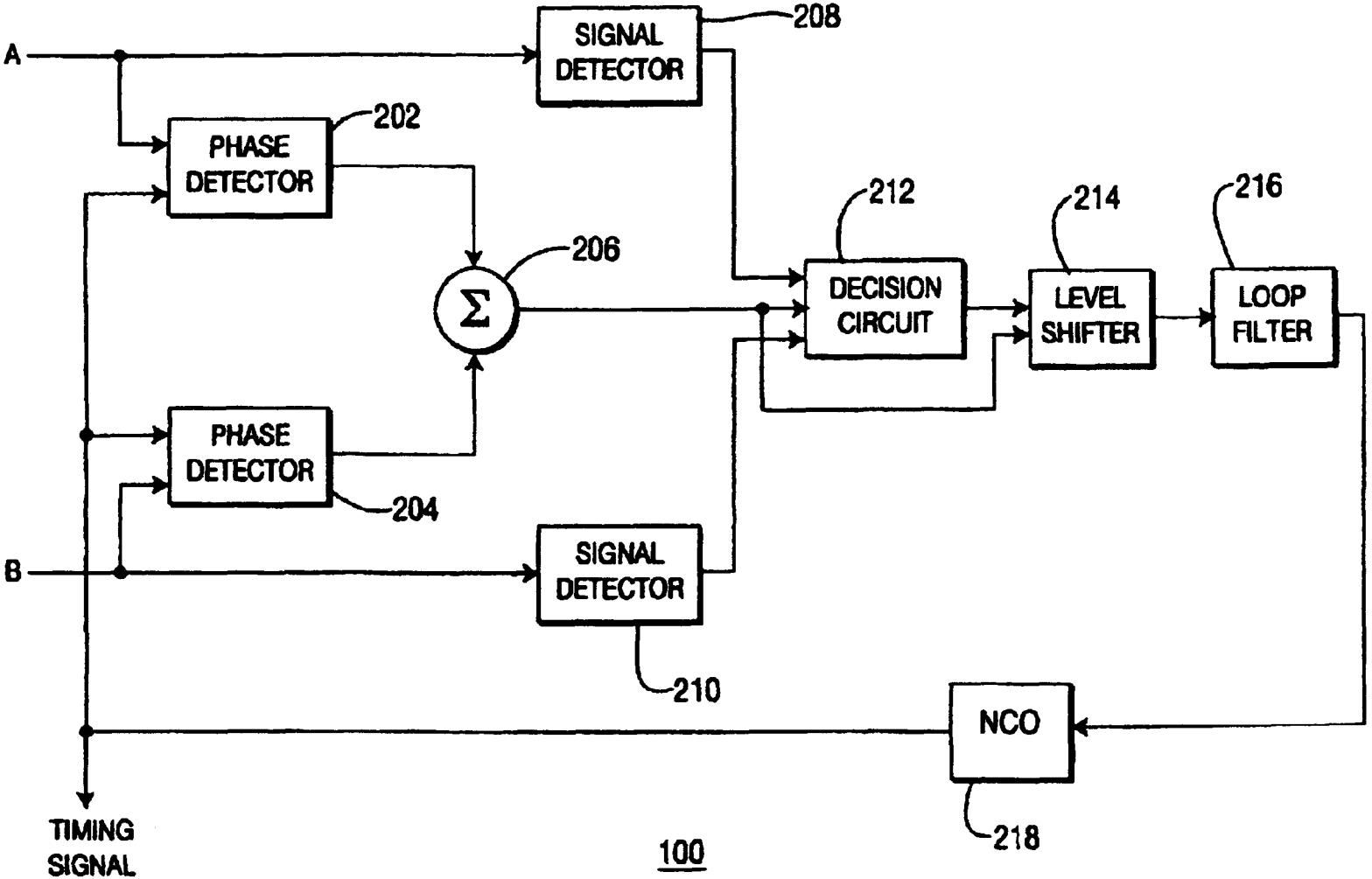
FIG. 2 depicts a block diagram of a joint timing recovery circuit in accordance with the present invention.

FIG. 2 depicts the joint timing recovery circuit 200 in accordance with the present invention. In one embodiment, the joint timing recovery circuit 200 performs joint timing recovery of two input signals A and B. For example, the input signals A and B may be received at different antennas (101 in FIG. 1), where the signals A and B are transmitted from the same source but received at different antennas i.e., a diversity receiver for combating multipath distortion. Such a diversity receiver enables the receipt of a valid signal despite multipath distortion, e.g., fading, in a communications channel. Although the circuit illustratively shows two input signals, the circuit 200 likewise applies to joint timing recovery of three or more input signals.

In one embodiment, the joint timing recovery circuit 200 comprises two phase detectors 202 and 204, a summer 206, signal detectors 208 and 210, a decision circuit 212, a level shifter 214, a loop filter 216 and a numerically controlled oscillator (NCO) 218. The phase detector 202 receives input signal A and the output of the NCO 218, compares the phases of these input signals, and generates a phase difference signal between input signal A and the NCO output. Similarly, the phase detector 204 receives input signal B and the output of the NCO 218, compares the phases of these input signals, and generates a signal (referred to herein as a phase signal) representing the difference in phase between input signal B and the NCO output.

The summer 206 adds the phase signals from the phase detectors 202 and 204. The sum of the phase signals is coupled to the decision circuit 212. The signal detectors 208 and 210 determine whether each of the respective inputs A and B are detectable. For example, the signal detectors 208 and 210 may determine whether the amplitude of each input signal A or B is greater than a threshold value. The status of the received signal, e.g., whether the signal was properly received, is coupled to the decision circuit 212.

The decision circuit 212 receives signals from the signal detectors 208 and 210 to determine the total number of input signals that were properly received in the joint timing recovery circuit 200. Thus, the decision circuit 212 may ignore a particularly weak input signal, i.e., an input signal having a low amplitude or signal level. In one embodiment, the decision circuit 212 comprises an n-bit priority encoder that outputs how many of up to $2^n-1$ inputs were received with a signal level that will facilitate accurate demodulation. For example, if the decision circuit 112 comprises a 2-bit priority encoder, the number of inputs may be 0, 1, 2 or 3.

The level shifter 214 uses the output of the decision circuit 212 to adjust the sum from the summer 206. Namely, the level shifter 214 adjusts the sum of the detected phases in response to the number of input signals that were detected as receivable by the signal detectors 208 and 210. The level shifter 214 adjusts the sum to be within the input range of the NCO 218. Otherwise, if the sum of the detected phases is outside the input range of the NCO 218, i.e., the sum is either too large or too small for the NCO 218, the NCO 218 cannot generate a signal with a correct phase estimate of any of the detected signals.

The level shifter 214 may use different approaches to adjust the sum of the detected phases. In one embodiment, the level shifter 214 divides the sum by the number of detected inputs. In another embodiment, the level shifter 214 either adds or subtracts an offset value to the sum of the phase detectors 202 and 204. For example, if the sum of detected phases is greater than the input range of the NCO 218, the level shifter [212] *214* would subtract the offset from the sum. Similarly, if the sum of the detected phases is less than the input range of the NCO 218, the level shifter [212] *214* would add the offset to the sum. The value of the offset is configured such that the adjusted sum is within the input range of the NCO 218.

The loop filter 216 filters the adjusted sum from the level shifter 214 to the NCO 218. The loop filter 216 typically comprises an integrator circuit that operates as a low pass filter. The NCO 218 receives the filtered sum and generates a phase estimate of the adjusted sum of detected phases. The generated phase estimate is coupled to the phase detectors 202 and 204. As such, only one NCO 218 is used to generate a common phase estimate for all the inputs, e.g., A and B, in the joint timing recovery system 200.

The phase estimate from the NCO is coupled to the phase detectors 202 and 204. The phase detectors 202 and 204 use the phase estimate and the input signals A and B to derive phase difference signals. Iteration of the phase difference signals in the joint timing recovery system 200 will stabilize the phase estimate from the NCO 218. The output of the NCO 218 is used as a timing signal, e.g., a timing recovery signal within the receiver.

By adjusting the sum of the detected phases within the input range of a single numerically controlled oscillator (NCO), the present invention generates a single timing signal for a receiver that receives multiple input signals. One such application of the joint timing recovery circuit 200 is a receiver having diverse antennas.

Although various embodiments which incorporate the teachings of the present invention have been shown and described in detail herein, those skilled in the art can readily devise many other varied embodiments that still incorporate these teachings.

What is claimed is:

1. A method for performing timing recovery comprising:

producing a [phase signal] *plurality of phase signals* by comparing a signal received at each of a plurality of inputs to a timing signal produced by a numerically controlled oscillator (NCO);

summing said *plurality of* phase signals to produce a sum;

adjusting said sum into an input range for the numerically controlled oscillator (NCO), wherein said adjusting comprises:

determining whether *the signal received at* each input can be accurately received, *wherein said determining comprises ignoring a received signal having a low amplitude or signal level*; and dividing the sum by a number of [potentially receivable inputs] *the received signals that were determined to be accurately received to produce an adjusted sum, wherein the number of the received signals that were determined to be accurately received is less than a number of the inputs that received a signal*; and producing [a] *the* timing signal within the NCO in response to the adjusted sum.

2. The method of claim 1 wherein said determining comprises:

determining whether an amplitude of *the signal received at* each input is greater than a threshold value.

3. A method for performing timing recovery comprising:

*a plurality of phase detectors* producing a *plurality of* phase signal*s, wherein each of the phase detectors comprises a respective first input that receives a respective signal, wherein each of the phase detectors comprises a respective second input that receives a timing signal produced by a numerically controlled oscillator (NCO), and wherein each of the phase detectors produces a respective phase signal of the plurality of phase signals* by comparing a *phase of the respective* signal received at [each of a plurality of inputs] *the first input of the phase detector* to a *phase of the* timing signal [produced by a numerically controlled oscillator (NCO)] *received at the second input of the phase detector*;

summing said *plurality of* phase signals to produce a sum;

adjusting said sum into an input range for the numerically controlled oscillator (NCO), wherein said adjusting comprises:

determining [whether each] *a number of the first* input*s that have a receivable signal,* [is receivable,] wherein said determining comprises:

determining whether an amplitude of each *signal at the first* input*s* is above a threshold value;

[determining an offset using a number of receivable inputs; and adjusting the sum using the offset; and]

*dividing said sum by the number of the first inputs that have a receivable signal to produce an adjusted sum, wherein the number of the first inputs that have a receivable signal is less than a number of the first inputs that receive a respective signal; and* producing [a] *the* timing signal within the NCO in response to the adjusted sum.

4. A method for performing timing recovery comprising:

producing a [phase signal] *plurality of phase signals* by comparing a signal received at each of a plurality of inputs to a timing signal produced by a numerically controlled oscillator (NCO);

summing said *plurality of* phase signals to produce a sum;

adjusting said sum into an input range for the numerically controlled oscillator (NCO), wherein said adjusting comprises:

determining whether each input [is receivable] *has a receivable signal*;

determining an offset using a number of *the inputs determined to have a* receivable [inputs] *signal*; and adjusting the sum using the offset *to produce an adjusted sum*, wherein said adjusting by said offset comprises:

adding the sum [by] *to* the offset if the sum is below the input range; and producing [a] *the* timing signal within the NCO in response to the adjusted sum.

5. A method for performing timing recovery comprising:

producing a [phase signal] *plurality of phase signals* by comparing a signal received at each of a plurality of inputs to a timing signal produced by a numerically controlled oscillator (NCO);

summing said *plurality of* phase signals to produce a sum;

adjusting said sum into an input range for the numerically controlled oscillator (NCO), wherein said adjusting comprises:

determining whether each input [is receivable] *has a receivable signal*;

determining an offset using a number of *the inputs determined to have a* receivable [inputs] *signal*; and adjusting the sum using the offset *to produce an adjusted sum*, wherein said adjusting by said offset comprises:

subtracting the *offset from the* sum [by the offset] if the sum is above the input range; and producing [a] *the* timing signal within the NCO in response to the adjusted sum.

6. An apparatus for performing timing recovery of a signal received at a plurality of inputs, said apparatus comprising:

a plurality of phase detectors each detecting a phase of said signal at a different input by comparing the input signal to a timing signal from a numerically controlled oscillator (NCO);

a summer for adding said detected phases to form a sum;

a level shifter for adjusting the sum to *produce an adjusted sum that is* within an input range of said NCO;

a loop filter for filtering the adjusted sum;

the NCO for generating [a] *the* timing signal in response to the filtered sum;

a plurality of signal detectors each for determining whether an input signal is receivable; and a decision circuit using a total of receivable input signals to determine an adjustment to the sum by said level shifter,

*wherein said decision circuit determines an offset that is added to or subtracted from the sum by said level shifter.*

[7. The apparatus of claim 6 wherein said decision circuit divides the sum by the total of receivable input signals.]

[8. The apparatus of claim 6 wherein said decision circuit determines an offset that is added to or subtracted from the sum by said level shifter.]

*9. An apparatus for performing timing recovery of a signal received at a plurality of inputs, said apparatus comprising:*

*a plurality of phase detectors each detecting a phase of said signal at a different input by comparing the input signal to a timing signal from a numerically controlled oscillator (NCO);*

*a summer for adding said detected phases to form a sum;*

*a level shifter for adjusting the sum to produce an adjusted sum that is within an input range of said NCO;*

*a loop filter for filtering the adjusted sum to produce a filtered sum;*

*the NCO for generating the timing signal in response to the filtered sum;*

*a plurality of signal detectors each for determining whether an input signal is receivable; and*

*a decision circuit using a total number of inputs determined to have a receivable input signal so as to determine an offset that is added to or subtracted from the sum by said level shifter.*

*10. An apparatus for performing timing recovery of a signal received at a plurality of inputs, the apparatus comprising:*

*means for producing a plurality of phase signals by comparing a signal received at each of a plurality of inputs to a timing signal produced by a numerically controlled oscillator (NCO);*

*means for summing the plurality of phase signals to produce a sum;*

*means for adjusting the sum into an input range for the numerically controlled oscillator (NCO), wherein the means for adjusting includes means to determine an offset using a number of receivable inputs and to adjust the sum so as to produce an adjusted sum by adding the offset to the sum or subtracting the offset from the sum; and*

*means for producing the timing signal within the NCO in response to the adjusted sum.*

*11. The apparatus of claim 10,*

*wherein the means for adjusting the sum into an input for the NCO comprises means for determining whether each input has a receivable signal, and*

*wherein determining whether each input has a receivable signal includes determining whether an amplitude of each input is greater than a threshold value.*

*12. An apparatus for performing timing recovery of a signal received at a plurality of inputs, the apparatus comprising:*

*means for producing a plurality of phase signals by comparing a signal received at each of a plurality of inputs to a timing signal produced by a numerically controlled oscillator (NCO);*

*means for summing the plurality of phase signals to produce a sum;*

*means for adjusting the sum to produce an adjusted sum that is within an input range for the numerically controlled oscillator (NCO), wherein the means for adjusting the sum comprises means for using a total number of inputs determined to have a receivable input signal so as to determine an offset for adjusting the sum; and*

*means for producing the timing signal within the NCO in response to the adjusted sum,*

*wherein if the sum is greater than the input range for the NCO, then adjusting the sum includes subtracting the offset from the sum, and*

*wherein if the sum is less than the input range for the NCO, then adjusting the sum includes adding the offset to the sum.*

*13. A method for performing timing recovery comprising:*

*producing a plurality of phase signals by comparing a signal received at each of a plurality of inputs to a timing signal produced by a numerically controlled oscillator (NCO);*

*summing the plurality of phase signals to produce a sum;*

*adjusting the sum into an input range for the numerically controlled oscillator (NCO), wherein the adjusting comprises (i) determining an offset using a number of inputs determined to have a receivable signal, and (ii) adjusting the sum using the offset to produce an adjusted sum, wherein adjusting the sum comprises adding the offset to the sum if the sum is less than the input range; and*

*producing the timing signal within the NCO in response to the adjusted sum.*

*14. A method for performing timing recovery comprising:*

*producing a plurality of phase signals by comparing a signal received at each of a plurality of inputs to a timing signal produced by a numerically controlled oscillator (NCO);*

*summing the plurality of phase signals to produce a sum;*

*adjusting the sum into an input range for the numerically controlled oscillator (NCO), wherein the adjusting comprises (i) determining an offset using a number of inputs determined to have a receivable signal, and (ii) adjusting the sum using the offset to produce an adjusted sum, wherein adjusting the sum comprises subtracting the offset from the sum if the sum is greater than the input range; and*

*producing the timing signal within the NCO in response to the adjusted sum.*

* * * * *